United States Patent [19]

Löschner et al.

[11] Patent Number: 5,672,449
[45] Date of Patent: Sep. 30, 1997

[54] SILICON MEMBRANE AND METHOD OF MAKING SAME

[75] Inventors: Hans Löschner, Vienna, Austria; Feng Shi, Kassel; Ivaylo W. Rangelow, Baunatal, both of Germany

[73] Assignees: IMS Ionen Mikrofabrikations Systeme GmbH, Vienna, Austria; Universitat Gesamthochschule Kassel, Kassel, Germany

[21] Appl. No.: 515,409

[22] Filed: Aug. 15, 1995

[30] Foreign Application Priority Data

Aug. 16, 1994 [AT] Austria ........................... 1585/94

[51] Int. Cl.⁶ .................................................. G03F 9/00
[52] U.S. Cl. ................... 430/5; 430/311; 430/313; 430/314; 156/628.1; 156/643.1; 156/657.1; 156/662.1
[58] Field of Search ........................ 430/5, 311, 313, 430/314; 156/628.1, 662.1, 643.1, 657.1

[56] References Cited

U.S. PATENT DOCUMENTS

| | | | |
|---|---|---|---|
| 4,256,532 | 3/1981 | Magdo | 156/628 |
| 4,647,517 | 3/1987 | Hersener et al. | 430/5 |
| 4,751,169 | 6/1988 | Behringer | 430/296 |

FOREIGN PATENT DOCUMENTS 0 367 750  5/1990  European Pat. Off. .

OTHER PUBLICATIONS

Silicon Cantilever Beams Fabricated by Electrochemically Controlled Etching for Sensor Applications, 1046 Journal of Electrochemical Society, Aug. 1986, P.M. Sarro et al.

1046b Extended Abstracts, vol. 81–1, May 1982, 2 pages.

Feng SHI, Kassel Jun. 1994, "Nasschemische Atzprozesse Zur Mikrostrukturierung Des Siliziums Fur Die Mikromechanik" pp. 1–102 & (4 intro pages).

B.S.T.J. Brief, "Electrochemically Controlled Thinning of Silicon".H.A.Waggener, pp. 473–475 Mar. 1970.

*Primary Examiner*—S. Rosasco
*Attorney, Agent, or Firm*—Herbert Dubno; Jonathan Myers

[57] ABSTRACT

A silicon membrane for use as a micromechanical sensor or as a mask for projection lithography is fabricated by doping a silicon wafer to different thicknesses at different portions and then electrochemically etching away the undoped portion of the wafer.

21 Claims, 4 Drawing Sheets

SILICON MEMBRANE AND METHOD OF MAKING SAME

FIELD OF THE INVENTION

Our present invention relates to a silicon membrane and to a method of making same. More particularly the invention relates to the production of a silicon membrane with predetermined stress characteristics, especially for use in micromechanical sensors like pressure sensors, force sensors or acceleration sensors, or as mask for electromagnetic beam or particle beam lithography, for example, X-ray projection lithography, electron-beam projection lithography or ion-beam projection lithography. The invention is especially directed to silicon membranes which are made starting from a silicon substrate of a given conductivity type by doping the substrate with a doping agent whose conductivity type is of the opposite polarity with respect to the conductivity type of the substrate and which is formed by electrochemical etching of the substantially undoped parts of the substrate.

BACKGROUND OF THE INVENTION

There are numerous processes for producing silicon membranes which can be used in micromechanical sensors or as masks.

A simple method of making such membranes utilizes an etching process in which the etching of a silicon substrate is terminated after a predetermined period of time. This timed etching process, however, has problems in obtaining a uniform thickness of membrane with a predetermined thickness.

In other techniques for producing thin silicon membranes, i.e. the so-called etch-stop techniques, the silicon substrate is pretreated (doped) in order to establish an etch stop at which etching of the substrate terminates.

In one process of this type (the p++ etch-stop technique) a surface layer of the silicon substrate is doped with boron in a high concentration (greater than $10^{19}$ cm$^{-3}$). In the course of the subsequent alkali etching process, the etching rate drops sharply when the etching reaches the boron-doped layer, thereby yielding a membrane whose thickness by and large corresponds to that of the boron-doped layer. Processes of this type are described inter alia in the U.S. Pat. No. 4,256,532 of Magdo et al and in the U.S. Pat. 4,589,952 of Behringer et al. Since the boron atoms incorporated in the silicon crystal are smaller than the silicon atoms, a tensile stress is generated in the silicon crystal structure and the resulting membrane has undesirably high stress which has a negative effect on the mechanical properties of the membrane. The boron doping also results in a high dislocation density so that the resulting membrane is exceptionally brittle.

One way of reducing the tensile stresses in such a membrane is to additionally dope the boron-doped layer with germanium atoms which are larger than silicon atoms and thus generate a pressure stress in the silicon crystal. This pressure stress can at least partly compensate the tensile stress resulting from boron doping in the membrane (compare Extended Abstracts, Vol. 82-1, May 1982, pages 192 ff). In this approach, the total stress in the membrane is indeed reduced but the stresses at the atomic level in the crystal lattice can be increased. The compensatory doping also has the drawback that the number of foreign atoms in the silicon crystal can become undesirably high and the membrane rendered highly brittle.

Good results are obtained with electrochemical etch-stop processes as has been described in EP-A-367,750 (IMS).

That process forms an etch stop as a pn transition or junction and the concentrations of the doping agents for the doping of the surface layer of the substrate are so selected that the resulting membrane will have the desired stress characteristics for the particular partitions. The type of stress (tensile or pressure stress) depends upon the size of the doping atoms relative to the silicon atom and the level of stress depends upon the concentrations of the doping agents. A membrane produced by this process has a constant thickness.

For special purposes in the micromechanic field and especially for use of such membranes as masks for projection lithography, the resulting stress characteristic of the silicon membrane is of great significance. In many cases it is desirable to carry out the production process in such a way that in the resulting membrane there are at least sections of the lowest possible stress.

OBJECTS OF THE INVENTION

It is, therefore, the principal object of the present invention to provide a silicon membrane and a process for making same which will result in a membrane having significantly reduced stress and thus higher mechanical stability.

It is another object of the invention to provide improved processes for making a silicon membrane which can take into consideration mechanical effects in further treatment of the membrane during the fabrication process itself.

Still another object of this invention is to provide an improved silicon membrane and method of making same which avoids drawbacks of earlier systems while maintaining some of the advantageous qualities thereof.

SUMMARY OF THE INVENTION

These objects can be attained, in accordance with the invention by masking a predetermined first portion of the surface of the silicon substrate and doping the nonmasked second portion of the silicon substrate with a doping agent in a predetermined concentration to form in this unmasked portion of the substrate a doped layer of a predetermined thickness. The masking of the first portion can then be removed and the silicon substrate doped with a doping agent in a predetermined concentration so that the unmasked first portion of the substrate has a doped layer of a comparatively reduced thickness. The silicon substrate is then electrochemically etched to the doped layers of the first and second portions, thereby removing the untreated part of the substrate, leaving a thin silicon membrane consisting of the at least one first portion and at least one second portion with a thickness of the first portions being less than that of the second portions.

Alternatively, a silicon substrate is provided with a barrier (or brake) layer of a predetermined thickness over first and second portions of the surface of the silicon substrate, the thickness of this barrier layer being reduced at the second portions by a predetermined amount. By implantation and/or diffusion a predetermined ion dose of a doping agent is applied through the barrier layer into the substrate to form a doped layer thereon. The thickness of this doped layer, because of the different braking effects of the barrier in the first and second portions of the substrate, is smaller at the first portions than the thickness of the doped layer at the second portions.

The barrier layer is then removed from the surface of the silicon substrate and the silicon substrate electrochemically etched to remove the untreated portions of the substrate and leave a silicon membrane which consists of the first and second portions with the thicknesses of the first portions less than the thicknesses of the second portions according to the invention. Therefore, the one-piece membrane consists of at least two different zones, namely at least one first portion of a predetermined thickness and at least one second portion whose thickness is comparatively greater. The thicker portion provides a mechanical reinforcement of the membrane on the one hand and on the other hand the thicker portion can exert a force onto the thinner portion. The mechanical characteristics of the membrane thus depend not only on the type or size of the doping atom and the doping concentrations of the membrane but also upon the arrangement of first and second portions and their selectively different thicknesses. The thickness difference is thus a further parameter which allows highly flexible selection of the membrane characteristics. The process is, moreover, economical and allows reproducible formation of the membranes with precisely predetermined mechanical characteristics.

From a practical point of view, the process of the invention allows a number of different embodiments of a silicon membrane to be produced.

In a first embodiment, for example, the second thicker portion substantially forms a border of the membrane while the first portion which is comparatively thinner lies wholly within the border and has a larger surface area than the thicker second portion. With this embodiment, the periphery or border can be doped with a higher doping concentration of the doping agent to establish in the silicon membrane a tensile stress which exerts substantial forces to the relatively large thinner portion within the frame provided by the border. An advantage of this embodiment is that it is a highly mechanically stable membrane which has an especially low doping within the large area of the inner portion.

In a second embodiment, the first thinner portion substantially forms a border around the membrane while the comparatively large thicker second portion is substantially wholly within the border. In this embodiment the thin border provides an elastic coupling of the large area thicker portion lying within the border. The stresses within the border are reduced by its elastic and the thick central portion of the membrane can be supported free from stress so that the overall membrane is also flat and highly stable mechanically. The elastic mounting of the membrane also enables additional stresses which may be applied in further processing of the membrane or in use to be reduced or compensated.

An especially advantageous embodiment of the silicon membrane of the invention provides that a membrane is used as a projection mask for electromagnetic beam or particle beam lithography in which Openings or holes are provided as a structuring of the mask. The density of the openings in the mask is a function of the position on the mask. The first portion of the silicon membrane which is of reduced thickness has a predetermined opening density while at least one second portion of comparatively greater thickness has a greater opening density. Of course the two portions have the respective doping concentrations as previously described.

In this embodiment the stresses of the membrane which result from its fabrication as well as the stresses resulting from forming the openings are taken into consideration in such a manner that a minimum dislocation and distortion of the mask structures are achieved. For example, with high opening densities there is a relatively significant change in the effective (Youngs) modulus so that without any measures, in such regions a greater dislocation of the mask structure can result. By providing the thicker second portion at precisely these locations of greater opening density, the changes in the effective (Youngs) modulus can at least partly be compensated and any dislocation which is structurally related to the high density of the holes or openings can be counteracted. In regions of low density of openings of the masks, the membrane suffers reduced change in effective (Youngs) modulus and the less opening density can thus be provided in the thinner first portions. By the interaction between the first and second portions, a local balance can be provided which minimizes dislocation of the mask structures and ensures that the membrane will remain mechanically stable. In addition the projection masks can also have frames or borders either from the first or second portions as has been indicated above.

The method of making a silicon membrane with predetermined stress characteristics for the purposes described, e.g. for projection masks for electromagnetic radiation or particle beam lithography, for example X-ray, electron beam or ion beam lithography or for use in micromechanical sensors, especially pressure, force or acceleration sensors, can comprise the steps of:

(a) masking at least one selected first portion of a surface of a silicon substrate of a conductivity type of one polarity with a mask and leaving unmasked the second portion of the surface;

(b) doping the second nonmasked portion of the surface with a doping agent of a conductivity type whose polarity is opposite the polarity of the conductivity type of the substrate to form a doped layer at the second portion;

(c) removing the mask from the first portion of the surface of the substrate;

(d) doping the surface with a doping agent in a predetermined concentration and of a conductivity type whose polarity is opposite the polarity of the conductivity type of the substrate to form in the first portion a doped layer of a smaller thickness than of said second portion; and (e) electrochemically etching the substrate to remove the substrate below the doped layers of the first and second portions to form a silicon membrane from the first and second portions whose first portion is thinner than its second portion.

In addition, this method can include the steps of:

($c_1$) after step (c), masking the second portion; and ($d_1$) removing the masking of the second portion following step (d).

Alternatively the method can comprise the steps of:

(a) forming a barrier layer of a certain thickness on first and second portions of a surface of a silicon substrate;

(b) reducing the thickness of the barrier layer by a certain amount on the second portion;

(c) doping the substrate through the barrier layer by implantation or diffusion with a predetermined ion dose, thereby forming a doped layer below the barrier layer and of a thickness greater at the second portion than at the first portion resulting from reduction of the thickness of the barrier layer by the certain amount on the second portion in step (b);

(d) removing the barrier layer from the surface of the silicon substrate; and (e) electrochemically etching the substrate to remove the substrate below the doped layer of the first and second portions to form a silicon membrane from the first and second portions whose first portion is thinner than its second portion.

The barrier layer can be an $SiO_2$ layer. In each of these methods, the thickness of the silicon membrane at the first portion can be less than 3 μm and at the second portion can be greater than 3 μm. Preferably the thickness of the silicon membrane at the first portion is 1 to 2.5 μm and at the second portion is 4 to 8 μm.

Advantageously the conductivity type of the silicon substrate is p conductivity and the doping agent is of n conductivity type.

The silicon substrate can be a boron-doped substrate and the doping agent may be selected from the group which consists of phosphorus and arsenic.

For example the doping agent for both the first and the second portion may be phosphorus.

The resulting silicon membrane has predetermined stress characteristics and is formed in one piece from a common silicon substrate of at least one first portion and at least one second portion, each of the first portions having a predetermined thickness and a doping agent in a predetermined concentration and of a conductivity type whose polarity is opposite a polarity of a conductivity type of the substrate, each of the second portions having a predetermined thickness greater than the thickness of each of the first portions and a doping agent in a predetermined concentration and of a conductivity type whose polarity is opposite a polarity of the conductivity type of the substrate.

BRIEF DESCRIPTION OF THE DRAWING

The above and other objects, features, and advantages will become more readily apparent from the following description, reference being made to the accompanying drawing in which.

SPECIFIC DESCRIPTION

Figure 1A:
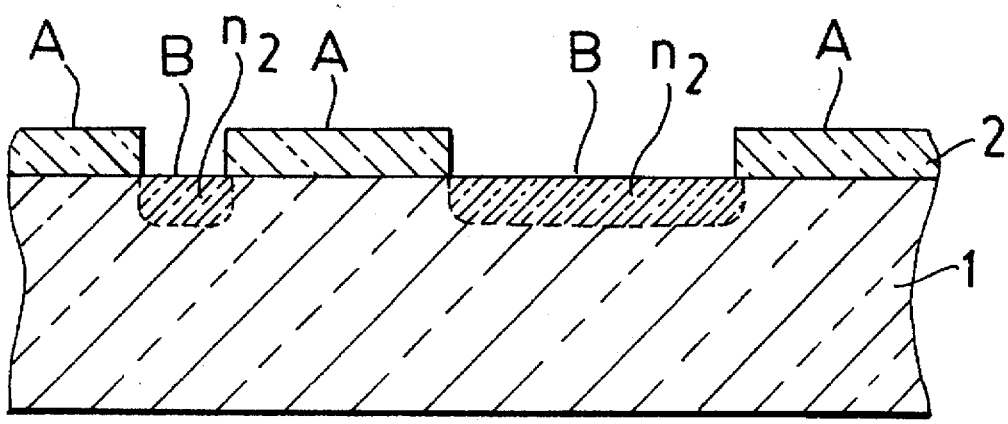
FIGS. 1a, 1b and 1c are cross sectional views through a substrate and membrane structure illustrating one embodiment of the invention.
Figure 1B:
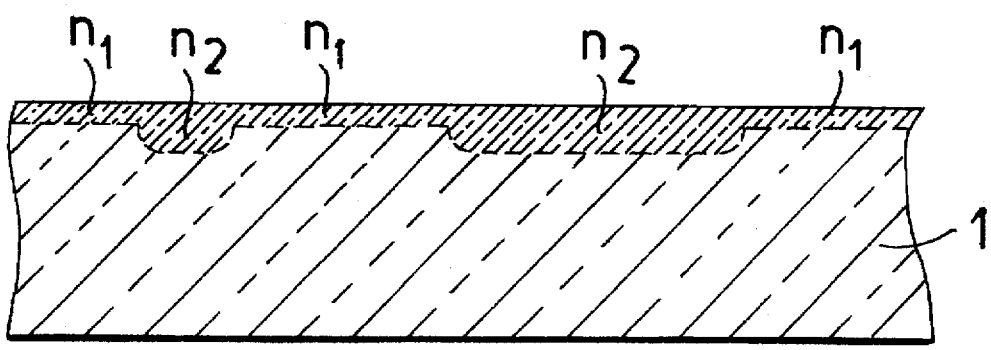
Figure 1C:
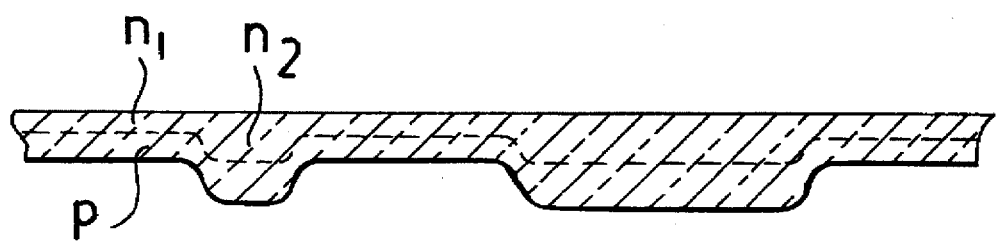

FIGS. 1a, 1b and 1c show the formation of a silicon membrane from a thin silicon plate, for example, a silicon wafer represented at 1. By choosing the conductivity characteristics of the silicon substrate (i.e. as n conducting or p conducting) the type of doping agent which can be used is restricted to the group of elements of the opposite conductivity type, since a pn transition is required for the etch stop.

For p-conducting, e.g. boron-doped, wafers, the doping agent should be of the electron donor group, for example, phosphorus or arsenic. For an n-conducting wafer, the doping agent should be an electron acceptor element, for example, boron or gallium. The choice of the doping agent is also dependent upon the type of stress which is intended to be generated in the of the silicon membrane. Doping atoms whose diameters are greater than that of the silicon atom in the lattice structure of the substrate, like gallium or arsenic, generate a pressure stress in the membrane. By contrast, doping atoms whose diameters are smaller than that of the silicon atom, like boron or phosphorus, generate a tensile stress in the membrane. The level of the stress generated is, in turn, a function of the relative size differences of the atoms and the concentration of the doping agent. The atomic radii of the most significant elements, given in $10^{-12}$ m are found in the table below (from R ompp Chemie Lexicon, 9th Edition)

| Element | B | P | Si | Ga | As | Sb |
|---|---|---|---|---|---|---|
| Atom Radius | 90 | 110 | 118 | 120 | 122 | 143 |

In FIG. 1a, a boron-doped wafer 1 which is p conducting is used. It is either doped with phosphorus which generates a tensile stress or with arsenic to generate a pressure stress. A combination of phosphorus and arsenic can be used for doping so that there is at least partial compensation of the pressure and tensile stresses which are produced.

In a first step of the process, the surface of a silicon wafer 1 is masked at a first portion A so that only the remaining second portion of the surface B is exposed.

For this purpose the silicon substrate is first coated with a layer 2 which is impermeable to the doping agent, for example a $SiO_2$ layer, which is etched away by a standard lithographic process to expose the portions B of the substrate surface.

The doping step may be carried out by conventional doping techniques. For this embodiment, it is advantageous that the doping agent is applied by coating or ion implantation process combined with diffusion, for example drive-in diffusion or with thermal activation, especially RTA (rapid thermal annealing) since these doping methods allow the doping concentration and depth to be controlled simply and with a high degree of precision. It is also possible to combine doping agent coating, ion implantation and diffusion or thermal activation with one another. The desired doping depth may also be achieved by thermal follow-up treatment.

After doping $n_2$ at second portion of the silicon wafer, with a doping agent of the opposite conductivity type, here an n conductivity type, the masking layer 2 remaining on the first portions A is removed, for example, by an appropriate $SiO_2$ solvent. If desired, the previously doped second portion B of the wafer may then be masked so that the next doping step, to form the region $n_1$ in the portions A, does not also additionally dope the second portions. In the embodiment illustrated at FIG. 1b, however, the second doping step may be effected across the entire surface of the substrate once the masking layer 2 is removed.

As can be seen from FIG. 1b, in the first portions the doping is effected to a small depth, i.e. that of the doping layer $n_1$, than in the second portions where the total doping depth is that of the layer $n_2$ previously implanted in the silicon wafer. The choice of the doping agent depends upon the stress characteristics desired in the resulting membrane. The depths to which the doping agent is introduced into the silicon wafer may be controlled by the thermal after-treatment or annealing.

The doping layers $n_1$ and $n_2$ in the portions A and B form a so-called pn transition at which the doping concentrations (n doping) equal the concentration of the base doping of the wafer (p doping).

The untreated or back side of the substrate is then subjected to electrochemical etching by connecting the n doped side of the wafer to one terminal of the electrochemical erosion power supply. An electrically-conductive layer, for example, a metal layer can be applied to this side of the substrate to ensure a uniform potential distribution over the surface of the silicon wafer.

The silicon wafer is then introduced into an electrochemical etching cell with an alkali etching solution, for example, or aqueous KOH-solution at a predetermined temperature.

One electrode, i.e. anode of the electrochemical etching cell is formed by the wafer itself, namely, by electrical connection to the metal coating on the doped wafer side. The second electrode (cathode) is formed by a plate resistant to the etching solution, for example, a gold or platinum plate, which is also conductive and is connected to the other terminal of the electrochemical erosion power supply. This plate is spaced from the wafer.

An electric voltage of, for example, 1.5 volts is applied. This voltage generates in the n doping layer a sufficiently high potential for passivation of the doping layer against the KOH etching solution. The remaining p wafer material is at a lower potential which does not result in any passivation so that it is etched away. Details of research into etching systems of this type may be found in the dissertation of Feng Shi, one of the present inventors at the University of Kassel, Germany, in the dissertation entitled, "Wet Chemical Etching Processes for the Microstructuring of Silicon for Micromechanics," Kassel 1994.

As the aforementioned dissertation indicates, the etching process stops before the pn transition is reached. That means that the resulting membrane constitutes a sandwich structure of an n-conducting and a p-conducting layer. The thickness of the remaining wafer material is directly proportional to the depth of the pn transition so that the resulting membrane (FIG. 1c) will have a reduced thickness of the first portion A by comparison of the thickness in the second portion B. In the following table the experimental results relating the depth of the pn transition to the membrane thickness, measured in µm, is given. These data derive from the aforementioned dissertation.

| pn Transition | 0.8 | 1.7 | 1.8 | 2.0 | 2.2 | 2.6 |
|---|---|---|---|---|---|---|
| Membrane Thickness | 1.64 | 3.81 | 3.82 | 4.29 | 4.48 | 5.41 |
| Doping Agent | As | As | P | P | P | P |

The concentration of the doping agent $n_1$ in the first portion can, depending upon the requirements, be smaller than, equal to or also greater than the concentration of the doping agent $n_2$ in the second portion. Depending upon the type of concentration of the doping agents in the respective portions, a predetermined stress characteristic can be ensured after fabrication of the membrane.

For practical purposes, the thickness of the membrane in the first portion should be smaller than 3 µm, preferably between 1 and 2.5 µm, while the membrane thickness in the second portion should be greater than 3 µm and preferably between 4 and 8 µm. Because of the practical experience with the electrochemical process as described above, i.e. the relation between the depth of the transition and pn the membrane thickness, the thickness of the doping layers must be accordingly smaller than the desired membrane thickness.

The different thickness of the membrane in the first and second portions, determined by the n conducting and p conducting layers of the resulting pn sandwich structure (see FIG. 1c) influence the resulting stress characteristics. The base-doped wafer, forming the p layer, is relatively stress-free because of its comparatively low doping concentration. By contrast, the more strongly doped n layer can have pressure or tension stress depending on the type of doping. The resulting stress in the sandwich structure is in an equilibrium and the degree of stress at each location can be established at fabrication of the membrane so that the invention provides a high degree of flexibility of the fabrication of membranes with predetermined stress characteristics.

The process also enables the entire substrate to be provided with a doping layer in a first doping step and, after masking of the first portion, a doping of the second portion. The sequence of steps, therefore, can be varied depending upon the requirements.

Figure 2A:
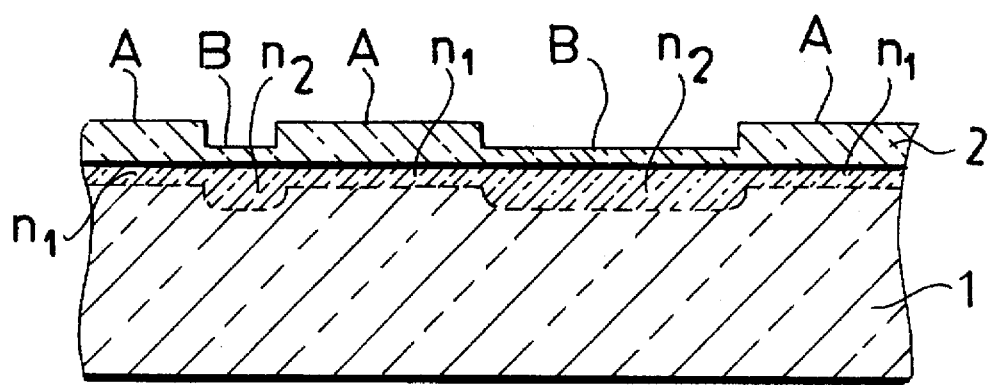
FIGS. 2a and 2b are similar views illustrating a second embodiment.
Figure 2B:
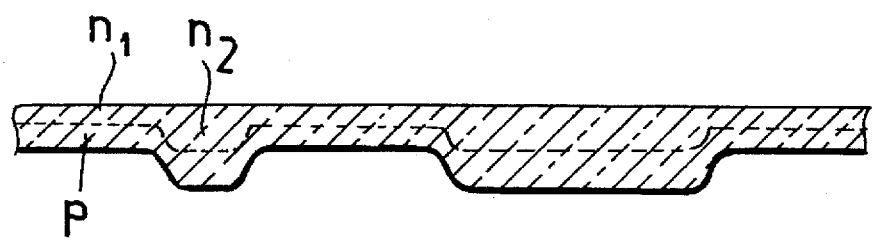

In FIGS. 2a and 2b, we have shown a further embodiment of the invention in which the doping of the surface layer is effected by ion implantation. The silicon wafer 1 (FIG. 2a) can be a p conducting structure formed, for example, by boron doping and the doping with the opposite conductivity doping agent can be effected with phosphorous or arsenic. In this embodiment, however, instead of masking the silicon surface and etching through the mask at portions to be exposed to doping, the substrate is coated with a barrier layer of a predetermined thickness.

This barrier layer can be, for example, a $SiO_2$ layer. The barrier layer in turn can be lithographically modified to have portions A and B of different thicknesses. For example, the portions A may have the original thickness of the $SiO_2$ layer while the thickness in the regions B can be reduced to reduce the braking effect upon the ion beam.

Upon ion implantation, therefore, in the regions $n_1$ a smaller thickness of the doping is effected than in the regions $n_2$. The ion beam is more strongly braked in the regions A and thus the ion penetration is significantly less.

In the present case, the absorbing power of the $SiO_2$ layer is in both portions A and B very low, so that the implanted ion dose is substantially the same in both portions.

As a consequence, the ion concentration in the regions $n_1$ in terms of implanted ions per unit volume, is greater than the ion concentration in the regions $n_2$, whereas the depth of penetration is less in the regions $n_1$ than in the regions $n_2$. The doping concentration, of course, is the mean concentration per unit volume since actually, the concentration of the doping agent approximately follows a gaussian function. With a single ion implantation step, therefore, utilizing this embodiment of the method, we can provide a first portion A with a highly doped layer $n_1$ of smaller thickness and a second portion B with a comparatively less doped layer $n_2$ of a greater thickness.

After ion implantation the $SiO_2$ barrier layer 2 can be removed and in a subsequent stop the implanted ions can be thermally activated so that the doping atoms, in the present case electron donors, can be effective as such. This annealing step provides, moreover, a final adjustment of the thickness of the doped layer $n_1$ and $n_2$ while maintaining a smaller thickness in the first portions A than in the second portions B.

The silicon substrate is then electrochemically etched to produce the desired membrane (FIG. 2b). Depending upon the choice of parameters (thickness of the barrier layer, doping agent, ion energy and ion dose) the silicon membrane with different thicknesses can have different stresses or homogeneous stress in the different portions.

This embodiment of the invention is not limited to doping by ion implantation. It is also possible to coat the substrate with the doping agent and control the thickness and concentration by controlled diffusion of the doping atoms through the barrier layer into the silicon substrate.

Figure 3:
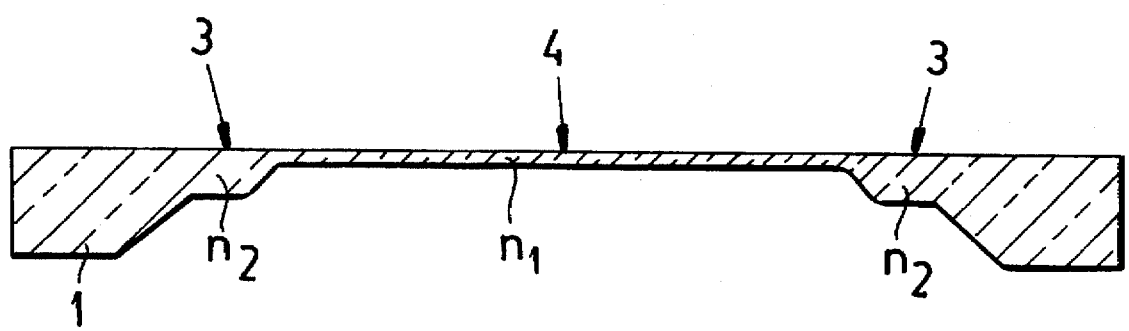
FIG. 3 is a schematic section through an embodiment of a silicon membrane of the invention having relatively thick border or framing portions.

FIG. 3 shows an embodiment of a silicon membrane as made from a p conducting wafer by phosphorous doping using either of the two techniques described. In this embodiment, a central region 4 is formed by the relatively thin portion $n_1$ while a frame is formed by the second portion $n_2$ at 3 of greater thickness around the central portion, the frame remaining integral with the balance of the wafer 1. In the highly doped frame or boundary portion, a relatively high tensile stress is generated while in the first portion $n_1$, because of a low doping concentration, a substantially stress-free region is formed.

Tension is thus generated in an outward direction all around the central region rendering the latter highly stable mechanically in spite of its reduced thickness. An important advantage of this embodiment is that the central membrane surface can have a low doping concentration while nevertheless the entire membrane has selected stress characteristics.

The notch characteristics of the membrane are also significantly reduced so that there is little tendency of the membrane to rupture at the junction between the frame and the central region.

The tensile stress in the frame 3 must be sufficient to maintain the planarity of the central portion 4 and that tensile stress will depend upon the type of concentration of the doping and the thickness and area of the central region. Empiric or analytic determinations to establish the optimum doping concentration in the frame regions are simple.

In another embodiment of the invention (not shown) for larger membranes, a rectangular and preferably square frame is provided and within this frame a multiplicity of thin portions can be formed which have low doping concentrations. Each of these portions may be a square portion separated from the others by a border of thicker highly doped membrane material. An embodiment of this type, is especially effective for sensors, in particular for large area micromechanical elements.

The width of the borders is comparatively small when the overall dimensions of the membrane are considered so that the greatest part of the membrane is formed by the thin region. The thin region forms the active membrane surface while the thicker border serves only as mechanical reinforcement and as a means for generating the required tension.

Figure 4A:
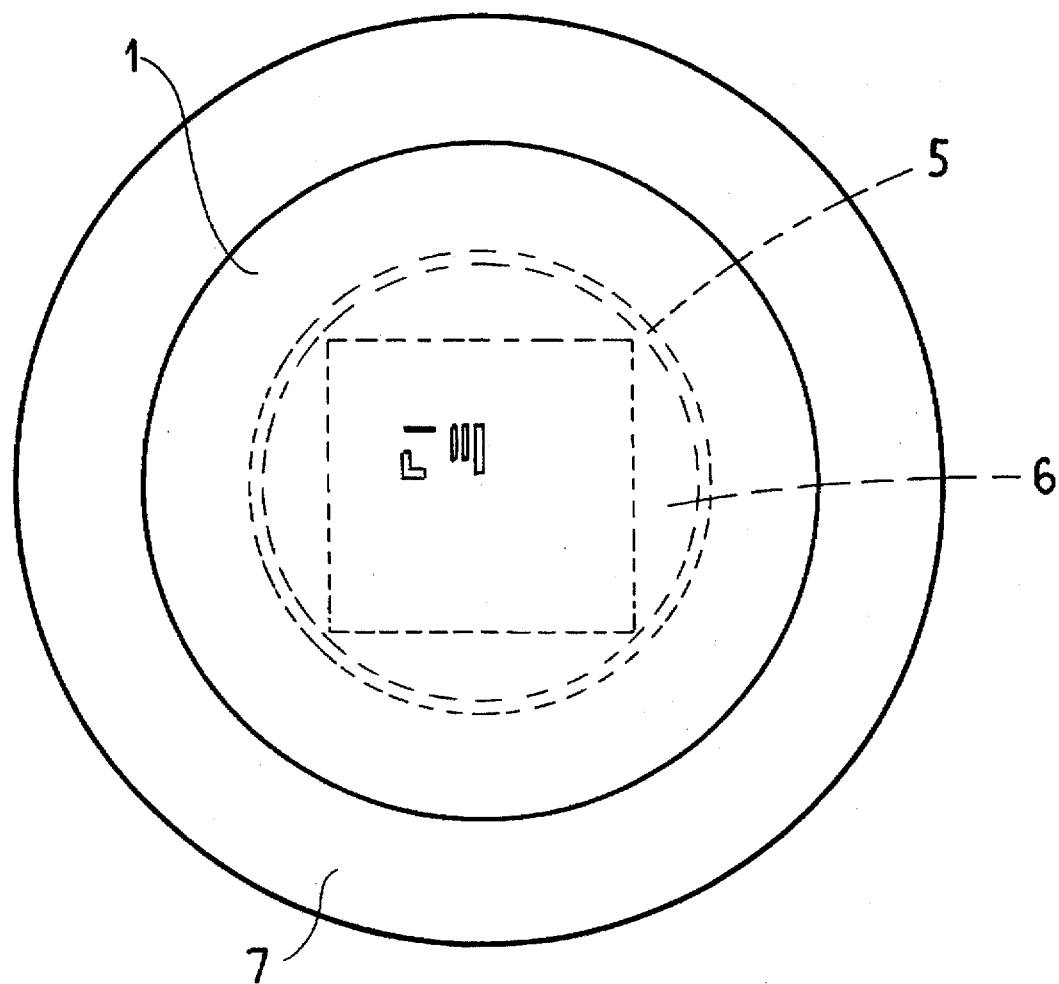
FIGS. 4a and 4b are an elevational view and a vertical section, respectively, showing a membrane forming a projection mask according to the invention.
Figure 4B:
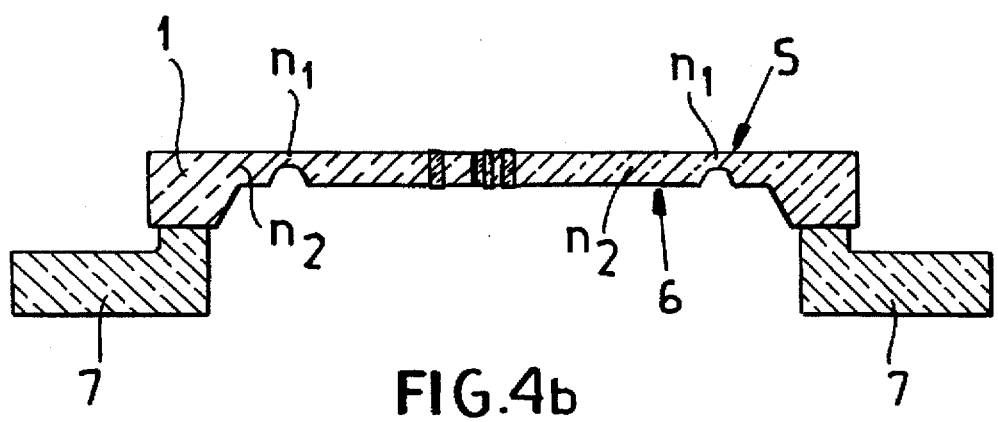

FIG. 4a and 4b show another embodiment of the membrane of the invention in which a thin region $n_1$ borders the thick region $n_2$ between the latter and the remaining structure of the silicon wafer. The frame 5 is here a thin member surrounding the thicker central region 6.

This embodiment is particularly suitable for use as a projection mask especially for X-ray or ion beam lithography. The diameter of the wafer 1 can be about 150 mm while the circular boundary 5 has a mean diameter of 110 mm and within the latter a square mask of dimensions of 75×75 mm can be provided. This mask can be structured with openings. The membrane is so fabricated that stresses in the membrane at the mask region are reduced to 2 to 5 MPa.

As can be ascertained from FIG. 4a this projection mask may be provided by bonding on its periphery on a suitable support 7, for example, a massive glass or silicon frame which simplifies the handling of the mechanically sensitive mask.

FIG. 4b shows that the border 5 is spaced from the outer edge of the membrane to reduce the notch effect at the transition between the massive portion of the wafer and the membrane.

The membrane portion 6 within the boundary 5 is mechanically stable as a result of the thickness selection and doping. Nevertheless in the region 6 a predetermined stress is generated by which is compensated by the boundary 5, the latter being a relatively elastic region by reason of its reduced thickness. In other words, the stresses resulting from fabrication are less than those in a membrane of constant thickness because of the elastic coupling of the thicker portion 6 with the massive part of the wafer 1 surrounding it. As a consequence, the membrane has good mechanical stability and is not subjected to significant dislocation of the mask structure in subsequent handling.

The stress imparted to the mask on fabrication can also compensate thermal expansion and contraction effects or lithographic beam (e.g. ion beam) stresses resulting upon use.

Figure 5:
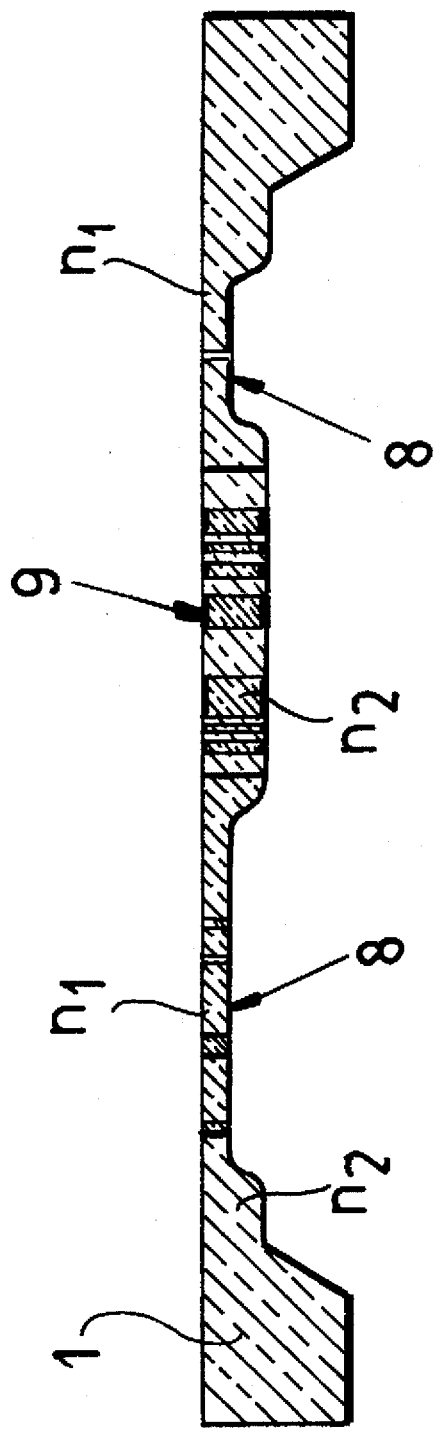
FIG. 5 is a schematic section through another membrane in the form of a silicon projection mask.

FIG. 5 shows another embodiment of a silicon membrane of the invention which is also used as a mask for ion beam lithography. In this embodiment, the first, thinner portions $n_1$ and the second, thicker portions $n_2$ are not, like in the above embodiments, arranged in a geometric pattern, but depending on the density of the openings in the mask. This means that regions 8 of the mask, which will contain only few mask openings or openings with small dimensions, will be provided with thin portions $n_1$, whereas regions 9 of the mask, where a great number of openings or openings with large areas are to be formed, will be provided with thick portions $n_2$. This arrangement of the different portions takes already care of the effect that the later formed mask openings will exert on the stresses within the mask. For in a membrane of constant thickness, the relative reduction of the effective Young's modulus is higher in regions 9 of the mask with a high density of openings than in regions 8 with a low density of openings. This would cause a change in the stress characteristic of the membrane after the forming of the mask structures. In a projection mask according to the invention, however, the reduction of the effective Young's modulus in regions 9 of high opening density is compensated to a great extent by the greater thickness of these regions, so that particularly small distortions and dislocations of the mask structures are to be expected.

While we have described preferred methods of forming the membrane with different thicknesses, in principle any method known in the art which can fabricate the silicon membrane with regions of different thickness can also be used. For example, epitaxial processes can be employed. Further portions can be provided on the membrane of other thickness steps which are greater than those of the second portions or less than those of the first portion 5. Finally, the description of the membranes as suitable as projection masks is intended only to indicate one of the potential uses for the membranes. Others will doubtlessly occur to the skilled worker in the art.

We claim:

1. A method of making a silicon membrane with predetermined stress characteristics, said method comprising the steps of:

(a) masking at least a selected first portion of a surface of a silicon substrate of a conductivity type of one polarity with a mask and leaving unmasked a second nonmasked portion of said surface;

(b) doping the second nonmasked portion of said surface with a doping agent of a conductivity type whose polarity is opposite the polarity of the conductivity type of said substrate to form a doped layer at said second portion;

(c) removing said mask from said first portion of the surface of said substrate;

(d) doping said surface with a doping agent in a predetermined concentration and of a conductivity type whose polarity is opposite the polarity of the conductivity type of said substrate to form in said first portion a doped layer of a smaller thickness than at said second portion; and (e) electrochemically etching said substrate to remove said substrate below the doped layers of said first and second portions to form a silicon membrane from said first and second portions whose first portion is thinner than its second portion.

2. The method defined in claim 1, further comprising the steps:

($c_1$) after step (c), masking said second portion; and ($d_1$) removing the masking of said second portion following step (d).

3. A method of making a silicon membrane with predetermined stress characteristics, said method comprising the steps of:

(a) forming a barrier layer of a certain thickness on first and second portions of a surface of a silicon substrate;

(b) reducing the thickness of said barrier layer by a certain amount on said second portion;

(c) doping said substrate through said barrier layer by implantation or diffusion with a predetermined ion dose, thereby forming a doped layer below said barrier layer and of a thickness greater at said second portion than at said first portion resulting from reduction of the thickness of said barrier layer by said certain amount on said second portion in step (b);

(d) removing said barrier layer from said surface of said silicon substrate; and (e) electrochemically etching said substrate to remove said substrate below the doped layer of said first and second portions to form a silicon membrane from said first and second portions whose first portion is thinner than its second portion.

4. The method defined in claim 3 wherein said barrier layer is an $SiO_2$ layer.

5. The method defined in claim 1 or claim 3 wherein the thickness of said silicon membrane at said first portion is less than 3 μm and at said second portion is greater than 3 μm.

6. The method defined in claim 5 wherein the thickness of said silicon membrane at said first portion is 1 to 2.5 μm and at said second portion is 4 to 8 μm.

7. The method defined in claim 1 or claim 3 wherein the conductivity type of the silicon substrate is p conductivity and the doping agent is of n conductivity type.

8. The method defined in claim 7 wherein said silicon substrate is a boron-doped substrate and said doping agent is selected from the group which consists of phosphorus and arsenic.

9. The method defined in claim 7 wherein said doping agent for both said first and said second portion is phosphorus.

10. A silicon mask made by the method of claim 1 or claim 3.

11. A silicon membrane with predetermined stress characteristics and formed in one piece from a common silicon substrate of at least one first portion and at least one second portion, each of said first portions having a predetermined thickness and a doping agent in a predetermined concentration and of a conductivity type whose polarity is opposite a polarity of a conductivity type of said substrate, each of said second portions having a predetermined thickness greater than the thickness of each of said first portions and a doping agent in a predetermined concentration and of a conductivity type whose polarity is opposite a polarity of the conductivity type of said substrate.

12. The silicon membrane defined in claim 11 wherein the thickness of each of said first portions is substantially 1 to 2.5 μm and the thickness of each of said second portions is 4 to 8 μm.

13. The silicon membrane defined in claim 12 wherein said silicon substrate is a boron-doped silicon of p conductivity type and said doping agent is selected from the group which consists of phosphorus and arsenic of n conductivity type.

14. The silicon membrane defined in claim 12 wherein said first portions are disposed as a substantially continuous border along substantially an entire periphery of the silicon membrane and said second portion is located substantially entirely within said border and has an area greater than the area of said border.

15. The silicon membrane defined in claim 14 wherein said border has in plan view a square configuration and said border has a width which is substantially smaller than side-length measurements of said membrane.

16. The silicon membrane defined in claim 14 or claim 15 wherein said border has in plan view a circular configuration and said border has a width which is substantially smaller than a diameter of said membrane.

17. The silicon membrane defined in claim 12 wherein said second portion is disposed as a substantially continuous border along substantially an entire periphery of the silicon membrane and said first portion is located substantially entirely within said border and has an area greater than the area of said border.

18. A silicon mask for electromagnetic beam or particle beam lithography comprising a silicon membrane structured with openings, said silicon membrane being formed in one piece from a common silicon substrate of at least one first portion and at least one second portion, each of said first portions having a predetermined thickness, a predetermined density of said openings, and a doping agent in a predetermined concentration and of a conductivity type whose polarity is opposite a polarity of a conductivity type of said substrate, each of said second portions having a predetermined thickness greater that the thickness of each of said first portions, a density of said openings greater than the density of openings of said first portions, and a doping agent in a predetermined concentration and of a conductivity type whose polarity is opposite a polarity of the conductivity type of said substrate.

19. A silicon mask as defined in claim 18 wherein a mean concentration of the doping agent in said first portions is equal to a mean concentration of the doping agent in said second portions.

20. A silicon mask as defined in claim 18 wherein a mean concentration of the doping agent in said first portions is less than a mean concentration of the doping agent in said second portions.

21. A silicon mask as defined in claim 18 wherein a mean concentration of the doping agent in said first portions is greater than a mean concentration of the doping agent in said second portions.

* * * * *